United States Patent [19]
Lebby et al.

[11] Patent Number: 5,400,352
[45] Date of Patent: Mar. 21, 1995

[54] SEMICONDUCTOR LASER AND METHOD THEREFOR

[75] Inventors: Michael S. Lebby, Apache Junction; Saied N. Tehrani, Scottsdale, both of Ariz.

[73] Assignee: Motorola, Inc., Schaumburg, Ill.

[21] Appl. No.: 210,851

[22] Filed: Mar. 21, 1994

[51] Int. Cl.⁶ .............................................. H01S 3/19
[52] U.S. Cl. ........................................ 372/45; 257/14; 437/129
[58] Field of Search ...................... 372/45, 44; 257/14, 257/15; 437/129

[56] References Cited

U.S. PATENT DOCUMENTS

| | | | |
|---|---|---|---|
| 5,061,970 | 10/1991 | Goronkin et al. | 257/15 |
| 5,172,384 | 12/1992 | Goronkin et al. | 372/45 |
| 5,270,225 | 12/1993 | Goronkin et al. | 437/129 |
| 5,286,982 | 2/1994 | Ackley et al. | 257/14 |
| 5,289,013 | 2/1994 | Goronkin et al. | 257/14 |

Primary Examiner—James W. Davie
Attorney, Agent, or Firm—Robert F. Hightower; Eugene A. Parsons

[57] ABSTRACT

A semiconductor laser (10) utilizes a material having a first band gap (26) for an active layer (13) of the laser (10). Monolayers (14) of a material having a smaller band gap are positioned in the active layer (13) without substantially altering the first band gap (26). The monolayers (14) have a combined thickness that is more than approximately 15 percent of the thickness (16) of the active layer (13).

18 Claims, 2 Drawing Sheets

SEMICONDUCTOR LASER AND METHOD THEREFOR

BACKGROUND OF THE INVENTION

The present invention relates, in general, to semiconductor devices, and more particularly, to quantum well semiconductor devices.

In the past, the semiconductor industry has utilized a variety of methods for implementing quantum well semiconductor devices. One particular problem with prior quantum well devices such as lasers, is the operating lifetime or reliability. During the operational lifetime, the efficiency typically decreases at a rate of approximately two to three percent per thousand hours of operation.

To increase the lifetime, indium typically is added to the material used to form the quantum well. For example, to increase the reliability of an aluminum gallium arsenide/gallium arsenide (AlGaAs/GaAs) laser, indium is added to a portion of the GaAs compound thereby forming an indium gallium arsenide (InGaAs) alloy. Although the addition of indium increases the lifetime, it also decreases the band gap within the quantum well. The narrower band gap results in increasing the wavelength of light emitted. This increased wavelength is not easily detectable by conventional photodiodes, thus, more expensive detectors must be utilized. Consequently, using indium to increase the operating lifetime also increases the cost of a system utilizing such quantum well emission devices.

Accordingly, it is desirable to have a quantum well semiconductor device that has a high indium content in the material that forms the quantum well and that has a quantum well band gap that is substantially not affected by the indium.

DETAILED DESCRIPTION OF THE DRAWINGS

Figure 1:
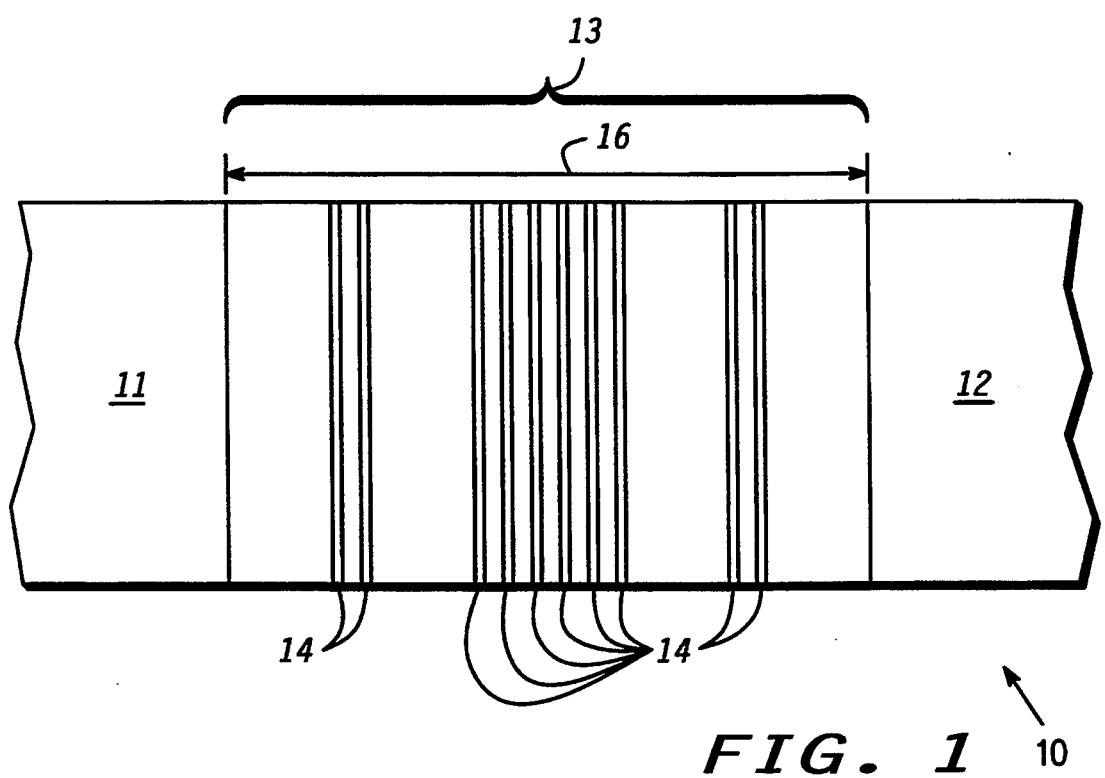
FIG. 1 illustrates an enlarged cross-sectional portion of a semiconductor laser in accordance with the present invention.

FIG. 1 illustrates an enlarged cross-sectional portion of a semiconductor laser 10 having an active layer 13 that is sandwiched between cladding layers 11 and 12. Active layer 13 has a band gap that is smaller than the band gap of cladding layers 11 and 12 in order to constrain carriers within active layer 13. In the preferred embodiment, cladding layers 11 and 12 are aluminum gallium arsenide having a graded aluminum concentration that varies from 0.1 near the interface with layer 13 to approximately 0.5 at a distal end of each of layers 11 and 12. Also in this preferred embodiment, active layer 13 is gallium arsenide (GaAs).

Active layer 13 has a spatial distribution of monolayers 14 of a material having a band gap that is smaller than the band gap of the material used for layer 13. It has been found that a large amount of a small band gap material may be inserted into a large band gap material without substantially changing the band gap of the large band gap material. The small band gap material is inserted as a number of monolayers spatially distributed throughout the large band gap material. As used herein, a monolayer is understood to have a thickness of approximately one molecular layer although a monolayer may have small portions with a thickness that exceeds one molecular layer and small portions that are voids, but the average thickness is substantially a molecular layer. The total thickness of all material used for monolayers 14 combined can be fifteen to twenty-five percent or greater of a thickness 16 of active layer 13 without changing the band gap within active layer 13 by more than fifteen percent.

In the preferred embodiment, each monolayer 14 is approximately 2.5 nanometers of indium arsenide. In this embodiment, layer 13 contains at least 8 monolayers 14 which represents at least twenty-five percent of thickness 16. Each monolayer 14 is formed by molecular beam epitaxy (MBE), atomic layer epitaxy (ALE), metal organic chemical vapor deposition (MOCVD), or other similar techniques that is well known in the semiconductor art.

Figure 2:
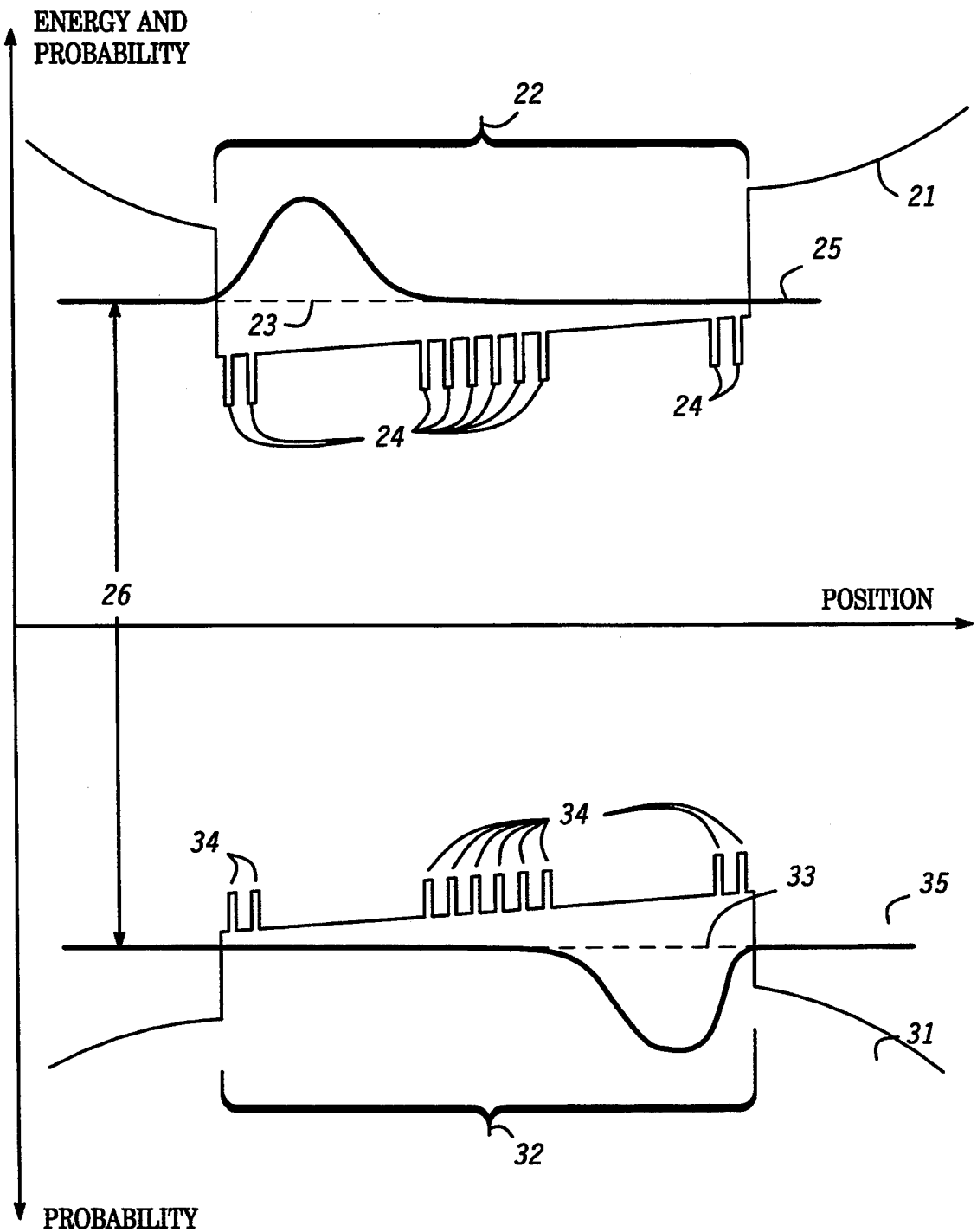
FIG. 2 is a graph illustrating electron and hole energies and probabilities in the laser of FIG. 1.

FIG. 2 is a graph illustrating electron and hole energy and probabilities within laser 10 of FIG. 1. The abscissa indicates position within laser 10 (FIG. 1) while the ordinate indicates increasing energy and probability. A diagram 21 illustrates the conduction band energy of laser 10 and a diagram 31 illustrates the corresponding valence band energy. The tilt of diagrams 21 and 31 result from the bias created by P-N doping of cladding layers 11 and 12. Diagrams 21 and 31 include an electron quantum well 22 and a hole quantum well 32, respectively, that are formed within active layer 13 of FIG. 1. Dashed lines 23 and 33 represent the sub-band quantized energy levels within quantum wells 22 and 32, respectively. The distance between dashed lines 23 and 33 represent a band gap 26 within layer 13 of FIG. 1. Quantum wells 24 and 34 represent the effect of monolayers 14 (FIG. 1) on the energy within quantum wells 22 and 32, respectively. An electron effective wave function 25 and a hole effective wave function 35 are utilized to determine the placement of monolayers 14 in FIG. 1. Electron effective wave function 25 is determined by multiplying the probability that a quantized energy state in the conduction band is occupied by an electron times the mass of an electron. Hole effective wave function 35 is determined by multiplying the mass of a hole times the probability that a quantized energy state is occupied by a hole. It has been found that arranging monolayers 14 (FIG. 1) so that quantum wells 24 and 34 are approximately centered to a point where the sum of effective wave functions 25 and 35 are a minimum prevents quantum wells 24 and 34 from having a substantial effect upon the value of band gap 26. Consequently, such an arrangement facilitates utilizing a high percentage of small band gap material in active layer 13 (FIG. 1) without substantially changing the wavelength of light emitted by laser 10.

In the preferred embodiment, approximately sixty percent of monolayers 14 (FIG. 1) are placed in a position within layer 13 that corresponds to where the sum of effective wave functions 25 and 35 has a minimum value, and the other forty percent are positioned at a point near, e.g. within five monolayers of, the edges of quantum wells 22 and 32 respectively. The total thickness of all monolayers 14 is greater than approximately twenty-five percent of thickness 16 (FIG. 1), but the indium changes band gap 26 less than fifteen percent.

For example, a GaAs layer 13 with InAs monolayers 14 being at least twenty-five percent of thickness 16 has a band gap 26 of approximately 1.4 to 1.7 electron volts.

Consequently, such a laser 10 emits light at a wavelength that is substantially the same as a gallium arsenide laser that does not utilize indium. Additionally, the operating lifetime of such a laser 10 degrades at approximately 0.2 to 0.3 percent per 1000 hours. This is an order of magnitude improvement over prior lasers.

The technique of spatially distributing multiple monolayers within an active layer to increase the amount of small band gap material without substantially changing the band gap within the active layer material is also applicable to other quantum well semiconductor devices. Additionally, other type materials can also be utilized, for example, In or InAs may be utilized within GaAs.

By now it should be appreciated that there has been provided a novel way to have a small band gap material comprise greater than twenty-five percent of the content of a large band gap material without substantially changing the band gap within the large band gap material. By spatially distributing monolayers of the small band gap material within the large band gap active layer material, the value of the large band gap is changed by less than approximately fifteen percent. By using this technique to provide a greater than twenty-five percent In content in a GaAs laser, the reliability is approximately 10 times that of a laser without the In. Also, the wavelength of light emitted by the laser can be detected by standard GaAs photodetectors. Consequently, this technique results in high reliability lasers having a lower system cost than prior lasers.

We claim:

1. A semiconductor laser comprising:
    a gallium arsenide active layer that forms a quantum well;
    a spatial distribution of indium arsenide monolayers within the active layer wherein a band gap within the active layer is approximately 1.4 to 1.7 electron volts.

2. The laser of claim 1 wherein the spatial distribution of indium arsenide monolayers is approximately centered to a point corresponding to where a sum of an electron effective wave function and a hole effective wave function has a minimum value.

3. The laser of claim 1 wherein the spatial distribution of indium arsenide monolayers includes approximately 60 percent of the indium arsenide monolayers grouped near a point corresponding to where a sum of an electron effective wave function and a hole effective wave function has a minimum value.

4. The laser of claim 3 wherein approximately 40 percent of the indium arsenide monolayers are grouped near outer edges of the quantum well.

5. The laser of claim 1 wherein the indium arsenide monolayers comprise at least 25 percent of a thickness of the active layer.

6. The laser of claim 1 further including a graded cladding layer adjacent the active layer.

7. A quantum well semiconductor device comprising:
    a layer of first material having a first band gap value;
    monolayers of a second material having a second band gap value that is less than the first band gap value, the monolayers of the second material positioned within the layer of first material and comprising at least 15 percent of a thickness of the layer of first material wherein the monolayers of the second material change the first band gap value by less than 15 percent.

8. The semiconductor device of claim 7 wherein the first material is gallium arsenide.

9. The semiconductor device of claim 7 wherein the second material is indium arsenide.

10. The semiconductor device of claim 9 wherein the monolayers of indium arsenide comprise at least 25 percent of the thickness.

11. The semiconductor device of claim 7 wherein the monolayers of the second material are substantially centered to a point corresponding to where a sum of an electron effective wave function and a hole effective wave function has a minimum value.

12. A method of forming a quantum well semiconductor device comprising:
    positioning monolayers of a first material having a first band gap within a second material having a second band gap that is larger than the first band gap wherein the second band gap is changed by less than 15 percent and wherein the monolayers have a total thickness that is at least approximately 15 percent of a thickness of the second material.

13. The method of claim 12 wherein the step of positioning monolayers of the first material includes positioning monolayers of the first material within gallium arsenide.

14. The method of claim 12 wherein positioning monolayers of the first material includes positioning monolayers of indium arsenide.

15. The method of claim 14 wherein positioning the monolayers of indium arsenide includes substantially centering the monolayers of indium arsenide to a point corresponding to where a sum of an electron effective wave function and a hole effective wave function of the second material has a minimum value.

16. The method of claim 12 further including having approximately 60 percent of the monolayers grouped near a point corresponding to where a sum of an electron effective wave function and a hole effective wave function of the second material has a minimum value.

17. The method of claim 16 further including having approximately 40 percent of the monolayers grouped near edges of a quantum well formed by the second material.

18. The method of claim 12 wherein the step of positioning the monolayers includes changing the second band gap to approximately 1.4 to 1.7 electron volts.

* * * * *